United States Patent
Baronian et al.

(10) Patent No.: US 12,228,591 B2
(45) Date of Patent: Feb. 18, 2025

(54) BUSBAR AS CURRENT SENSOR

(71) Applicant: EATON INTELLIGENT POWER LIMITED, Dublin (IE)

(72) Inventors: Armen Baronian, Toronto (CA); Yash Veer Singh, Menomonee Falls, WI (US); Piranavan Suntharalingam, Menomonee Falls, WI (US); Mikhail Goykhman, Reseda, CA (US); Galen Chui, Ladera Ranch, CA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 289 days.

(21) Appl. No.: 17/780,444

(22) PCT Filed: Nov. 25, 2020

(86) PCT No.: PCT/EP2020/025536
§ 371 (c)(1),
(2) Date: May 26, 2022

(87) PCT Pub. No.: WO2021/104670
PCT Pub. Date: Jun. 3, 2021

(65) Prior Publication Data
US 2023/0003765 A1    Jan. 5, 2023

Related U.S. Application Data

(60) Provisional application No. 62/941,463, filed on Nov. 27, 2019.

(51) Int. Cl.
*G01R 1/20* (2006.01)
*G01R 1/02* (2006.01)
(Continued)

(52) U.S. Cl.
CPC ......... *G01R 1/203* (2013.01); *G01R 19/0023* (2013.01); *G01R 19/32* (2013.01); *H02M 7/003* (2013.01)

(58) Field of Classification Search
CPC . G01R 1/02; G01R 1/04; G01R 1/067; G01R 1/073; G01R 1/20; G01R 19/00; G01R 19/32
See application file for complete search history.

(56) References Cited

U.S. PATENT DOCUMENTS 3,886,818 A   6/1975  Wurst
5,828,559 A  10/1998  Chen
(Continued)

FOREIGN PATENT DOCUMENTS

EP   0 016 756 A1  10/1980
EP   3 678 295 A1   7/2020
(Continued)

OTHER PUBLICATIONS

International Search Report and Written Opinion of the International Searching Authority for International Patent Application No. PCT/EP2020/025536 mailed Mar. 29, 2021, 13 pages.
(Continued)

*Primary Examiner* — Neel D Shah
(74) *Attorney, Agent, or Firm* — Merchant & Gould P.C.

(57) ABSTRACT

A current sensing system includes a pre-calibrated busbar, a voltage sensor, a temperature sensor and a controller. The pre-calibrated busbar has a known resistance, a known variation in resistance with respect to temperature and known dimensions. The voltage sensor detects a difference in voltage between a first location and a second location on the pre-calibrated busbar. The temperature sensor detects an ambient temperature of the pre-calibrated busbar. The controller determines a resistance of the busbar between the first
(Continued)

location and the second location based on the known resistance, known variation in resistance, known dimensions and the ambient temperature. The controller additionally determines a current flowing through the pre-calibrated busbar based on the difference in voltage and the determined resistance. The current sensing system has numerous applications including using the determined current to control an operating condition of a solid state circuit breaker or a solid state power controller.

6 Claims, 2 Drawing Sheets

(51) Int. Cl.

| | | |
|---|---|---|
| *G01R 1/04* | (2006.01) | |
| *G01R 1/067* | (2006.01) | |
| *G01R 1/073* | (2006.01) | |
| *G01R 19/00* | (2006.01) | |
| *G01R 19/32* | (2006.01) | |
| *H02M 7/00* | (2006.01) | |

(56) References Cited

U.S. PATENT DOCUMENTS

| | | |
|---|---|---|
| 6,028,426 A | 2/2000 | Cameron et al. |
| 6,411,109 B1 | 6/2002 | Hanson |
| 2002/0109952 A1* | 8/2002 | Rapsinski ............ H02H 9/042 361/91.1 |
| 2004/0052012 A1 | 3/2004 | Boughton et al. |
| 2009/0039836 A1 | 2/2009 | Asada |
| 2013/0154391 A1 | 6/2013 | Urciuoli |
| 2014/0015515 A1 | 1/2014 | Satou |
| 2015/0355244 A1 | 12/2015 | Sato |
| 2016/0164274 A1 | 6/2016 | Dawley |
| 2016/0291059 A1 | 10/2016 | Ausserlechner |

FOREIGN PATENT DOCUMENTS

| | | |
|---|---|---|
| JP | 2005-181119 A | 7/2005 |
| JP | 2006-230168 A | 8/2006 |
| JP | 2019-047474 A | 3/2019 |

OTHER PUBLICATIONS

Castro Simas, M. et al., "Smart drive of power transistors", Conference Record of the Industry Applications Society Annual Meeting, 810-818 (Oct. 1989), Abstract only.

Kapoor, R. et al., "State of Art of Power Electronics in Circuit Breaker Technology", IEEE, 615-622 (2012).

Pursorn, W. et al., "Low Cost AC Solid State Circuit Breaker", IEEE, 1724-1729 (2007).

Ziegler, S. et al., "Investigation Into Static and Dynamic Performance of the Copper Trace Current Sense Method", EEE Sensors Journal, 9(7): 782-792 (Jul. 2009), Abstract only.

\* cited by examiner

BUSBAR AS CURRENT SENSOR

CROSS-REFERENCE TO RELATED APPLICATION

This application is a National Stage Application of PCT/EP2020/025536, filed on Nov. 25, 2020, which claims the benefit of U.S. Patent Application Ser. No. 62/941,463, filed on Nov. 27, 2019, the disclosures of which are incorporated herein by reference in their entireties. To the extent appropriate, a claim of priority is made to each of the above disclosed applications.

TECHNICAL FIELD

The present disclosure is directed to a current sensor and, more particularly, to utilizing a pre-calibrated busbar as a device to determine current flowing through the busbar.

BACKGROUND

Mechanical circuit breakers have been used for years to protect electrical components from short circuits or over current conditions, e.g., an electrical fault. However, a time lag between the occurrence of an electrical fault and a mechanical circuit breaker actually breaking the circuit exists due to the slow response time of the breaker's mechanical components. Moreover, as system ratings rise lag times of a mechanical circuit breaker also rise.

As such, there has been a move towards solid state circuit breakers (SSCBs). SSCBs utilize electronic switches, which have no moving parts, in place of mechanical switches. The electronic switches enable the SSCB to respond to an electrical fault much more quickly than a mechanical circuit breaker and, thereby, provide more responsive protection to electrical circuit components.

An increase in electrical subsystems within aerospace and automotive applications has made circuit protection a top priority in these sectors and SSCBs have become a preferred choice to provide this protection. However, due to the weight and volume constraints (e.g., many electrical components in a small space) present in aerospace and automotive applications, current density within an electrical subsystem must be high. Accordingly, the weight and volume of every electrical component is of concern including the weight and volume of an SSCB.

SUMMARY

The present disclosure is directed to a current sensor that has numerous applications and is particularly suited to, for example, a solid state power control system or, its equivalent, a solid state circuit breaker (SSCB) system whose weight and volume is reduced by eliminating a high weight, high volume current detector relied upon by an SSCB. The function of the current detector is replaced by utilizing an existing busbar as a current measurement shunt resistor. The busbar, in combination with a voltage measurement of the voltage between first and second voltage detection points on the busbar and thermal properties of the busbar, are used to provide current monitoring for the SSCB system.

A first aspect of the present disclosure is directed to a solid state circuit breaker system that includes a parallel configuration of an electronic switching module and an electronic energy absorbing module, a voltage sensor and a controller. The parallel configuration is connected between a voltage source, via a busbar, and a load. The voltage sensor detects a difference in voltage between a first location on the busbar and a second location on the busbar. The controller determines the current flowing to the parallel configuration based on the difference in voltage and based on the electrical resistance of the busbar.

Another aspect of the present disclosure is directed to a method of determining an over current fault to activate a solid state circuit breaker that is coupled between a power supply, via a busbar, and a load. The method includes obtaining a difference in voltage between a first location on the busbar and a second location on the busbar. The method further includes determining an electrical resistance of the busbar between the first and second locations as well as determining a current flowing to the solid state circuit breaker based on the difference in voltage and the electrical resistance of the busbar. The method further includes determining that an over current fault has occurred based on the determined current exceeding a rated amperage capacity of the load.

Still another aspect of the present disclosure is directed a current sensing system. The system generally includes a pre-calibrated busbar, a voltage sensor, a temperature sensor and a controller. The pre-calibrated busbar has a known resistance, a known variation in resistance with respect to temperature and known dimensions. The voltage sensor detects a difference in voltage between a first location and a second location on the pre-calibrated busbar. The temperature sensor detects an ambient temperature of the pre-calibrated busbar. The controller determines a resistance of the busbar between the first location and the second location based on the known resistance, known variation in resistance, known dimensions and the ambient temperature. The controller additionally determines a current flowing through the pre-calibrated busbar based on the difference in voltage and the determined resistance.

DETAILED DESCRIPTION

Figure 1:
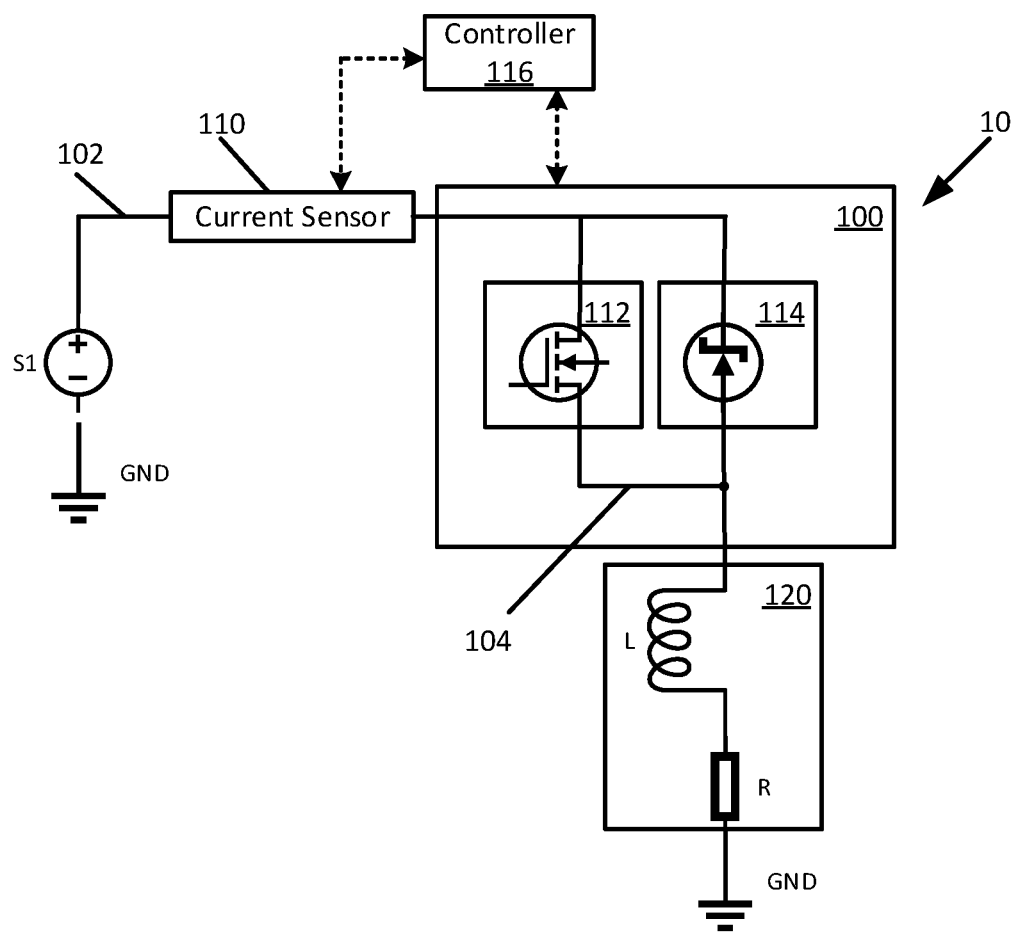
FIG. 1 is a prior art diagram of solid state circuit breaker system using an external current sensor for detecting over current faults.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

Whenever appropriate, terms used in the singular also will include the plural and vice versa. The use of "a" herein means "one or more" unless stated otherwise or where the use of "one or more" is clearly inappropriate. The use of "or" means "and/or" unless stated otherwise. The use of "comprise," "comprises," "comprising," "include," "includes," and "including" are interchangeable and not intended to be limiting. The term "such as" also is not intended to be limiting. For example, the term "including" shall mean "including, but not limited to."

Efforts continue to expand the functionality and use of electrical systems in automobile, aircraft and other applications where the volume and/or weight of the electrical system are constrained. For example, high voltage and high current electrical systems are being proposed for future aircraft ranging from 230 V AC to 1000 V DC, and above. Accordingly, the volume and/or weight of an electrical system's power converter plays an important role in efficient and effective power management as does the volume and/or weight of the circuit breaker that protects electrical components supplied by the converter. Volume and weight constraints affect selection of every electrical component within an electrical system. As such, any possibility to reduce weight or volume of an electrical component is highly desirable.

Reduction in weight and volume within volume-constrained and/or weight-constrained electrical systems has, at least in-part, been achieved by replacing mechanical circuit breakers with solid state circuit breakers (SSCBs). SSCBs replace the traditional moving parts of an electromechanical circuit breaker with power electronics and software algorithms that control power and can interrupt a current within microseconds. In order to operate, SSCBs rely on a component that can be used to measure and monitor current flow. Typically, a current sensor, such as a hall effect sensor, provides the current monitoring ability external to the SSCB. However, the current sensor adds significant weight, takes up significant space and reduces current density. An alternative solution provides for the addition of a shunt resistor external to the SSCB that is used to monitor current flow. However, an external shunt resistor is typically a power resistor that is high in weight, subjects the electrical system to power dissipation and may, itself, require additional cooling.

FIG. 1 depicts a simplified diagram of an SSCB system 10 with an external current sensor 110. As shown, a power source S1 is coupled, via a first busbar 102, through the current sensor 110 to the SSCB 100, which is coupled to a second busbar 104 and positioned ahead of a load 120; the load 120 is represented by inductor L and resistor R. The SSCB 100 includes an electronic switching module 112 in parallel with an electronic energy absorbing module 114 controlled by a controller 116 receiving input from the current sensor 110. The switching module 112 carries the current through normal operation. However, when a fault occurs (e.g., the current sensor 110 indicates an over current) the controller 116 directs the switching module 112 to open/trip while the current stored in the line is dissipated by the energy absorbing module 114 thereby protecting the load 120.

Figure 2:
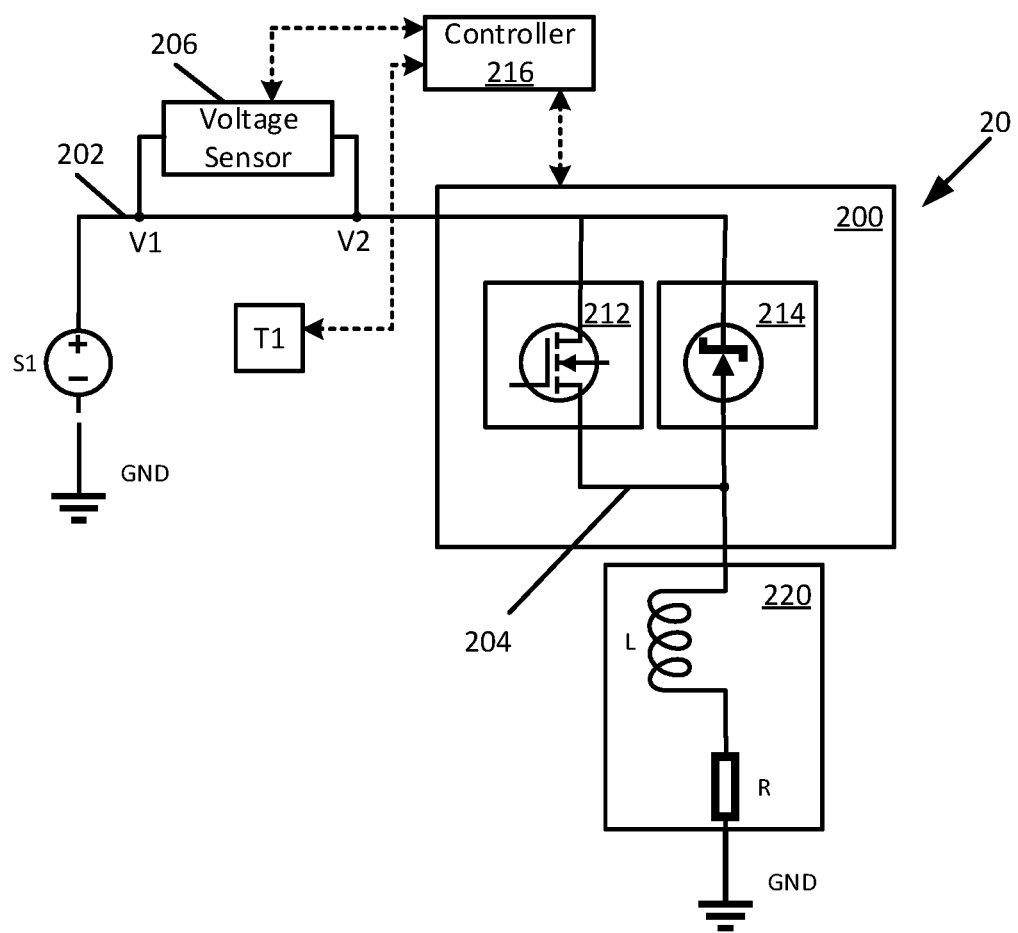
FIG. 2 is a diagram of a solid state circuit breaker system of the present disclosure utilizing an existing busbar, absent an external current sensor, for detecting over current faults.

The present disclosure provides an SSCB system 20 that utilizes an existing pre-calibrated busbar for current monitoring thereby eliminating the need for an external current sensor or an external shunt resistor. FIG. 2 depicts a simplified diagram of the SSCB system 20 of the present disclosure. As shown, a power source S1 is coupled, via a first busbar 202 (absent a current sensor) to the SSCB 200, which is coupled to a second busbar 204 and positioned ahead of a load 220; the load 220 is represented by an inductor L and a resistor R. An added voltage sensor 206 measures the difference in voltage between a first location V1 and a second location V2 on the first busbar 202 while an added temperature sensor T1 detects the temperature of the first busbar and/or detects the temperature of the atmosphere surrounding the first busbar 202 (e.g., the ambient temperature). A controller 216 is in communication with the voltage sensor 206, the temperature sensor T1 and the SSCB 200.

The first busbar 202 comprises a pre-calibrated busbar having a known resistance, a known variation in resistance with respect to temperature and known dimensions. The pre-calibrated busbar is fabricated from copper or any other material having good electrical conductivity.

The voltage sensor 206 comprises an operational amplifier (op-amp) or another suitable electrical component or circuit capable of determining the voltage difference between first and second locations, V1 and V2, on the first busbar 202 and capable of producing an output representative of that difference. The temperature sensor T1 comprises a thermocouple, resistance thermometer (RTD), thermistor or any suitable electronic component or circuit capable of obtaining a temperature and producing an output representative of that temperature.

The SSCB 200 includes a parallel electronics configuration comprising an electronic switching module 212 in parallel with an electronic energy absorbing module 214; the parallel electronics configuration is controlled by the controller 216.

The electronic switching module 212 generally includes a main switch such as a thyristor, a gate turn-off thyristor (GTO), integrated gate commutated thyristor (IGCT), insulated gate bipolar transistor (IGBT), metal oxide semiconductor field effect transistor (MOSFET) or other appropriate electronic switch. The electronic switching module 212 can be a single switch or a combination of series and/or parallel switches. Further, the electronic switching module 212 can also be a unidirectional switch or a bidirectional switch that has current blocking capabilities. The electronic switching module 212 can additionally include auxiliary switches and passive elements.

The electronic energy absorbing module 214 generally comprises a varistor, zener diode, resistor, transient-voltage suppression diode (TVS) or other appropriate electronic energy absorbing component.

The controller 216 generally comprises a field programmable gate array (FPGA), digital signal processing (DSP) based controller or other suitable controller.

In normal operation, the electronic switching module 212 carries the current. However, when an over current fault occurs (e.g., the current exceeds the rated amperage capacity of the load on the circuit) as described further herein, the controller 216 instructs the switching module 212 to open/trip and the current stored in the line is dissipated by the energy absorbing module 214 thereby protecting the load 220.

Over current fault detection, and current monitoring in general, is achieved through use of the existing first busbar 202 (e.g., the pre-calibrated busbar) as a current measurement shunt resistor. More specifically, the electrical and thermal properties of the existing first busbar 202 are used to determine current (and determine the presence of the over current fault) without adding an additional external current sensor or an additional external shunt resistor. Rather, additional elements include the voltage sensor 206 and the temperature sensor T1 which, in the present context, are smaller electrical components that have a combined weight and volume less than that of an external current sensor or an external shunt resistor. The signal from the voltage sensor 206, representing the difference in voltage between locations V1 and V2 on the first busbar 202, and the signal from the temperature sensor T1, representing the temperature of the first busbar 202, are provided to the controller 216 which uses the signals to calculate/determine current flowing to the SSCB 200. More specifically, current is determined by the controller 216, as programmed, according to Equation (1) below:

$$I = \frac{V}{R} \qquad \text{Eq. (1)}$$

Where:
I=determined current;
V=difference in voltage detected on busbar;
R=f(r,t,l,A);
Where:
   R=electrical resistance of first busbar;
   r=electrical resistivity of the first busbar material;
   t=temperature of first busbar provided by T1;
   l=length of the first busbar between V1 and V2;
   A=area of the first busbar between V1 and V2.

The current determined by the controller 216, through Equation (1), is monitored by the controller 216 to determine if a rated amperage capacity of the load 220 is exceeded. When the controller 216 determines that the rated amperage capacity is exceeded an over current situation is occurring and the controller 216 directs the electronic switching module 212 to trip creating an open circuit. As such, the solid state circuit breaker system 200 of the present disclosure provides the same functionality as one utilizing a current sensor without the weight and volume imposed by an added external current sensor or added external shunt resistor.

It should be noted that, while the present disclosure is directed to a specific application (e.g., a solid state circuit breaker or an equivalent interchangeable device such as a solid state power controller) of current measurement utilizing a pre-calibrated busbar with voltage and temperature detection, the current measurement technique can also be utilized in other electronic applications as appreciated by one skilled in the art. For example, the current measurement technique utilizing a pre-calibrated busbar with voltage and temperature detection could also be used with converters, distribution devices, controllers, etc.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed:

1. A solid state circuit breaker system, comprising:
a parallel configuration comprising an electronic switching module connected in parallel with an electronic energy absorbing module, the parallel configuration connected between a voltage source, via a busbar, and a load;
a voltage sensor detecting a difference in voltage between a first location and a second location on the busbar;
a temperature sensor indicating a temperature of the busbar;
a controller determining the current flowing to the parallel configuration based on the difference in voltage and the electrical resistance of the busbar based on the following:

$$I = \frac{V}{R}$$

Where:
I=determined current;
V=difference in voltage detected between the first location and the second location;
R=f(r,t,l,A);
Where:
   R=electrical resistance of the busbar;
   r=electrical resistivity of the busbar material;
   t=temperature of first busbar provided by the temperature sensor;
   l=length of the first busbar between the first location and the second location;
   A=area of the first busbar between the first location and the second location.

2. The system of claim 1, wherein the over current fault trips a switch in the electronic switching module to open a circuit between the power source and the load.

3. A method of determining an over current fault to activate a solid state circuit breaker, the solid state circuit breaker being coupled between a power supply, via a busbar, and a load, the method comprising:
obtaining a difference in voltage between a first location and a second location on the busbar;
determining a temperature of the busbar;
determining an electrical resistance of the busbar between the first and second locations;
determining a current flowing to the solid state circuit breaker based on the difference in voltage and the electrical resistance of the busbar based on the following;

$$I = \frac{V}{R}$$

Where:
I=determined current;
V=difference in voltage detected between the first location and the second location;
R=f(r,t,l,A);
Where:
   R=electrical resistance of the busbar;
   r=electrical resistivity of the busbar material;
   t=temperature of first busbar provided by the temperature sensor;
   l=length of the first busbar between the first location and the second location;
   A=area of the first busbar between the first location and the second location;
determining that an over current fault has occurred based on the determined current exceeding a rated amperage capacity of the load; and
in response to determining that an over current fault has occurred, tripping a switch in an electronic switching module to open a circuit between the power source and the load.

4. A solid state circuit breaker system, comprising:
a parallel configuration of an electronic switching module connected in parallel with an electronic energy absorbing module, the parallel configuration connected between a voltage source, via a busbar, and a load;

a temperature sensor detecting an ambient temperature of the busbar; and a voltage sensor detecting a difference in voltage between a first location on the busbar and a second location on the busbar;

a controller determining the current flowing to the parallel configuration based on the following equation:

$$I = \frac{V}{R}$$

Where:
I=determined current;
V=difference in voltage detected on busbar;
R=f(r, t, l, A);
Where:
R=electrical resistance of first busbar;
r=electrical resistivity of the first busbar material;
t=temperature of first busbar provided by T1;
l=length of the first busbar between V1 and V2;
A=area of the first busbar between V1 and V2.

5. A current sensing system, comprising:
a pre-calibrated busbar having a known resistance, a known variation in resistance with respect to temperature and known dimensions;
a voltage sensor detecting a difference in voltage between a first location and a second location on the pre-calibrated busbar;
a temperature sensor detecting an ambient temperature of the pre-calibrated busbar; and
a controller determining:
  a resistance of the busbar between the first location and the second location based on the known resistance, known variation in resistance, known dimensions and the ambient temperature;
  a current flowing through the pre-calibrated busbar based on the difference in voltage and the determined resistance based on $$I = \frac{V}{R}$$

Where:
I=determined current;
V=difference in voltage detected between the first location and the second location;
R=f(r,t,l,A);
Where:
R=electrical resistance of the busbar;
r=electrical resistivity of the busbar material;
t=temperature of first busbar provided by the temperature sensor;
l=length of the first busbar between the first location and the second location;
A=area of the first busbar between the first location and the second location; and
an electronic switching module configured to open a circuit between a power source and a load in response to determining that an over current fault has occurred based on the determined current flowing through the pre-calibrated busbar.

6. A current sensing method comprising:
obtaining a difference in voltage between a first location and a second location of a pre-calibrated busbar, the pre-calibrated busbar having a known resistance, a known variation in resistance with respect to temperature and known dimensions;
obtaining an ambient temperature of the busbar;
determining a resistance of the busbar between the first location and the second location based on the known resistance, known variation in resistance, known dimensions and the ambient temperature;
determining a current flowing through the pre-calibrated busbar based on the difference in voltage and the determined resistance according to $$I = \frac{V}{R}$$

Where:
I=determined current;
V=difference in voltage detected between the first location and the second location;
R=f(r,t,l,A);
Where:
R=electrical resistance of the busbar;
r=electrical resistivity of the busbar material;
t=temperature of first busbar provided by the temperature sensor;
l=length of the first busbar between the first location and the second location;
A=area of the first busbar between the first location and the second location; and
controlling an operating condition of a solid state circuit breaker or an operating condition of a solid state power controller based on the determined current.

* * * * *